(12) United States Patent
Ishida et al.

(10) Patent No.: US 9,070,607 B2
(45) Date of Patent: Jun. 30, 2015

(54) METHOD OF MANUFACTURING SEMICONDUCTOR DEVICE

(71) Applicant: Advantest Corporation, Tokyo (JP)

(72) Inventors: Masahiro Ishida, Tokyo (JP); Daisuke Watanabe, Tokyo (JP); Masayuki Kawanabe, Tokyo (JP)

(73) Assignee: Advantest Corp., Tokyo (JP)

( * ) Notice: Subject to any disclaimer, the term of this patent is extended or adjusted under 35 U.S.C. 154(b) by 256 days.

(21) Appl. No.: 13/656,186

(22) Filed: Oct. 19, 2012

(65) Prior Publication Data

US 2013/0115723 A1    May 9, 2013

(30) Foreign Application Priority Data

Nov. 9, 2011   (JP) ................................ 2011-245406

(51) Int. Cl.
| | |
|---|---|
| *H01L 21/66* | (2006.01) |
| *H01J 37/317* | (2006.01) |
| *B82Y 10/00* | (2011.01) |
| *B82Y 40/00* | (2011.01) |
| *H01J 37/304* | (2006.01) |

(52) U.S. Cl.
CPC ............. *H01L 22/14* (2013.01); *H01J 37/3174* (2013.01); *H01J 2237/31754* (2013.01); *H01J 2237/31793* (2013.01); *H01L 22/20* (2013.01); *B82Y 10/00* (2013.01); *B82Y 40/00* (2013.01); *H01L 2924/0002* (2013.01); *H01J 37/304* (2013.01); *H01J 2237/31798* (2013.01)

(58) Field of Classification Search
CPC .......... H01L 22/12; H01L 22/14; H01L 22/26
USPC ........................................................... 438/10
See application file for complete search history.

(56) References Cited

U.S. PATENT DOCUMENTS

| | | | | |
|---|---|---|---|---|
| 5,943,550 | A * | 8/1999 | Fulford et al. .................. 438/14 |
| 6,346,426 | B1 * | 2/2002 | Toprac et al. ..................... 438/8 |
| 6,946,668 | B1 * | 9/2005 | Watanabe ................ 250/492.22 |
| 7,391,023 | B2 * | 6/2008 | Enichen et al. .............. 250/310 |
| 7,635,843 | B1 * | 12/2009 | Luo et al. ...................... 250/307 |
| 2003/0162341 | A1 * | 8/2003 | Raebiger et al. ............. 438/197 |
| 2004/0156223 | A1 * | 8/2004 | Tanaka et al. ................ 365/145 |
| 2004/0265711 | A1 * | 12/2004 | Robinson ....................... 430/30 |
| 2006/0281199 | A1 * | 12/2006 | Matsushita .................... 438/14 |
| 2007/0264729 | A1 * | 11/2007 | Anderson et al. .............. 438/14 |
| 2011/0033789 | A1 * | 2/2011 | Ogino ............................ 430/30 |
| 2011/0193138 | A1 * | 8/2011 | Watanabe et al. ............. 257/252 |

FOREIGN PATENT DOCUMENTS

| | | |
|---|---|---|
| JP | 2004-158820 | 6/2004 |
| JP | 2006-39227 | 2/2006 |
| JP | 2008-277540 | 11/2008 |

* cited by examiner

*Primary Examiner* — Steven J Fulk
(74) *Attorney, Agent, or Firm* — Muramatsu & Associates (57) ABSTRACT

In a method of manufacturing a semiconductor device using an electron beam lithography apparatus configured to emit an electron beam to perform lithography of a pattern, processing including pattern formation with the electron beam lithography apparatus is performed on a wafer, and an electric characteristic of the thus manufactured semiconductor devices is measured by a semiconductor testing apparatus. Then, electron beam lithography data to be used by the electron beam lithography apparatus is adjusted based on a result of measurement of the electric characteristic so as to reduce a variation in the electric characteristic of the semiconductor device within a surface of the wafer.

6 Claims, 12 Drawing Sheets

METHOD OF MANUFACTURING SEMICONDUCTOR DEVICE

CROSS-REFERENCE TO RELATED APPLICATION

This application is based upon and claims the benefit of priority of the prior Japanese Patent Application No. 2011-245406 filed on Nov. 9, 2011, the entire contents of which are incorporated herein by reference.

BACKGROUND OF THE INVENTION

1. Field of the Invention

The embodiments discussed herein are related to a method of manufacturing a semiconductor device and a semiconductor manufacturing system, or more specifically, to a method of manufacturing a semiconductor device and a semiconductor manufacturing system which involve a lithography process using an electron beam.

2. Description of Related Art

In a semiconductor manufacturing process, variations in manufacturing conditions occur in the course of ion implantation, lithography, annealing, film deposition, polishing, dicing, and so forth. As a consequence, electric characteristics of manufactured semiconductor devices vary within a wafer surface.

To address this, at the time of startup or after maintenance of a semiconductor manufacturing line, manufacturing conditions for procedures including ion implantation, lithography, annealing, film deposition, polishing, dicing, and so forth are optimized in order to improve a production yield of semiconductor devices.

However, the optimization of the manufacturing conditions for the procedures requires a huge number of operating steps which may increase manufacturing costs of the semiconductor devices.

The above noted conventional technologies are described, for example, in Japanese Laid-open Patent Publication Nos. 2008-277540, 2006-39227 and 2004-158820, respectively.

SUMMARY OF THE INVENTION

In view of the above, it is an object of the present invention to provide a method of manufacturing a semiconductor device and a semiconductor manufacturing system, which are capable of reducing a variation in a characteristic of a semiconductor device within a wafer surface with a smaller number of operating steps.

According to an aspect of the invention, there is provided a method of manufacturing a semiconductor device using an electron beam lithography apparatus configured to emit an electron beam to perform lithography of a pattern, the method comprising: a wafer processing step of forming a semiconductor device by performing processing inclusive of pattern formation on a wafer using the electron beam lithography apparatus; a semiconductor testing step of measuring an electric characteristic of the semiconductor device; and a lithography data adjusting step of adjusting electron beam lithography data used by the electron beam lithography apparatus on the basis of a variation in the electric characteristic of the semiconductor device within a surface of the wafer. The wafer processing step, the semiconductor testing step, and the lithography data adjusting step are repeatedly carried out.

According to another aspect of the invention, there is provided a semiconductor manufacturing system comprising: a wafer processing section configured to form a semiconductor device by performing processing on a wafer, the wafer processing section including an electron beam lithography apparatus configured to irradiate the wafer with an electron beam to perform lithography of a pattern; a semiconductor testing apparatus configured to measure an electric characteristic of the semiconductor device; and a controller configured to adjust electron beam lithography data used by the electron beam lithography apparatus on the basis of a variation in the electric characteristic of the semiconductor device within a surface of the wafer.

According to the above-described aspects, a change in the characteristic of the semiconductor device is detected by the semiconductor testing device. And then a lithography data is adjusted so as to reduce a variation in a characteristic of a semiconductor device.

As a consequence, the variation in the characteristic of the semiconductor device within the wafer surface can be reduced without adjusting the manufacturing conditions individually in the respective semiconductor manufacturing procedures.

Thus, the variation in the characteristic of the semiconductor device can be reduced with a smaller number of operating steps.

DETAILED DESCRIPTION OF EMBODIMENTS

Embodiments of the present invention will be described below with reference to the accompanying drawings.

First Embodiment

Figure 1:
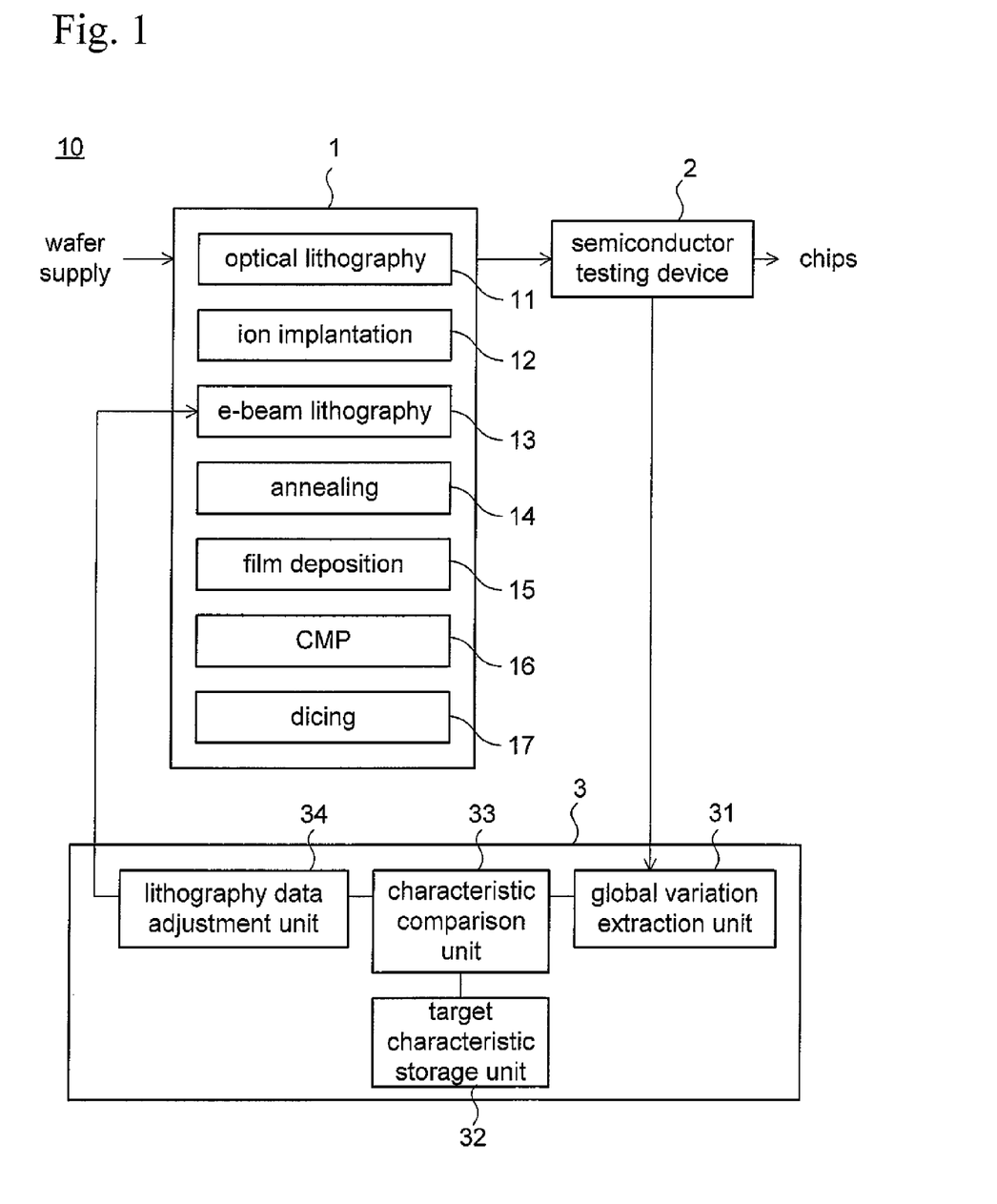
FIG. 1 is a block diagram of a semiconductor manufacturing system according to a first embodiment.

FIG. 1 is a block diagram of a semiconductor manufacturing system according to a first embodiment.

As shown in FIG. 1, a semiconductor manufacturing system 10 of this embodiment includes a wafer processing section 1, a semiconductor testing apparatus 2, and a controller 3.

The wafer processing section 1 includes an optical lithography apparatus 11, an ion implantation apparatus 12, an electron beam lithography apparatus 13, an annealing apparatus 14, a film deposition apparatus 15, a CMP apparatus 16, and a dicing apparatus 17 configured to cut a wafer (a semiconductor substrate) into chips. Semiconductor chips are manufactured by performing various processes on a supplied wafer using these apparatuses.

The electron beam lithography apparatus 13 is capable of performing lithography at high precision and is therefore used for formation of a gate electrode and the like of a transistor which requires dimensional precision. The electron beam lithography apparatus 13 draws a pattern based on electron beam lithography data, which is transmitted from the controller 3 to be described later.

A semiconductor chip manufactured by the above-described wafer processing section 1 is sent to the semiconductor testing apparatus 2. The semiconductor testing apparatus 2 measures electric characteristics of the transistor including a current characteristic, a threshold voltage, a signal propagation delay characteristic, a noise level, integral non-linearity, differential non-linearity, and so forth. Test equipment such as ATE (automatic test equipment) can be used as the semiconductor testing apparatus 2.

Then, a judgment is made on the basis of test results by the semiconductor testing apparatus 2 as to whether the manufactured semiconductor chip is defective or non-defective. In the meantime, the test results by the semiconductor testing apparatus are sent to the controller 3 together with positional information concerning the semiconductor chip on the wafer.

The controller 3 includes a global variation extraction unit 31, a target characteristic storage unit 32, a characteristic comparison unit 33, and a lithography data adjustment unit 34. The controller 3 adjusts the electron beam lithography data so as to reduce variations in the electric characteristics among the semiconductor chips within the wafer surface.

The variations in the characteristics of the semiconductor devices include a local variation which occurs irrespective of the position on the wafer and a global variation which occurs depending on the position on the wafer.

The local variation is also called a random variation and its occurrence is attributed to Gaussian noise generated at the time of manufacture. Such local variations occur in an uncorrelated manner within the wafer surface or among wafers and are therefore hard to be corrected.

On the other hand, the global variation is also called a systematic variation and its occurrence is attributed to a variation in a processing condition of the semiconductor manufacturing system. Accordingly, similar global variations appear among different wafers. This embodiment therefore focuses on such a global variation and performs correction with respect to the global variation.

Specifically, the global variation extraction unit 31 of the controller 3 extracts a global variation from the variations in the electric characteristics of the semiconductor chip.

The target characteristic storage unit 32 stores target characteristic data representing distribution of target values of the electric characteristic of the semiconductor devices in respective positions on the wafer. For the purpose of reducing the variation in the characteristic of the semiconductor devices, this target characteristic data is usually designed to have the same value across the wafer The characteristic comparison unit 33 compares the global variation with the target characteristic data, calculates a difference between the target value and the global variation in each position on the wafer, and outputs the respective differences to the lithography data adjustment unit 34.

The lithography data adjustment unit 34 adjusts the electron beam lithography data concerning each position on the wafer in such a manner as to reduce the difference between the global variation and the target characteristic data. Then, the lithography data adjustment unit 34 outputs the adjusted electron beam lithography data to the electron beam lithography apparatus 13. In this way, the adjusted electron beam lithography data is reflected in an upcoming electron beam lithography process for another wafer.

Figure 2:
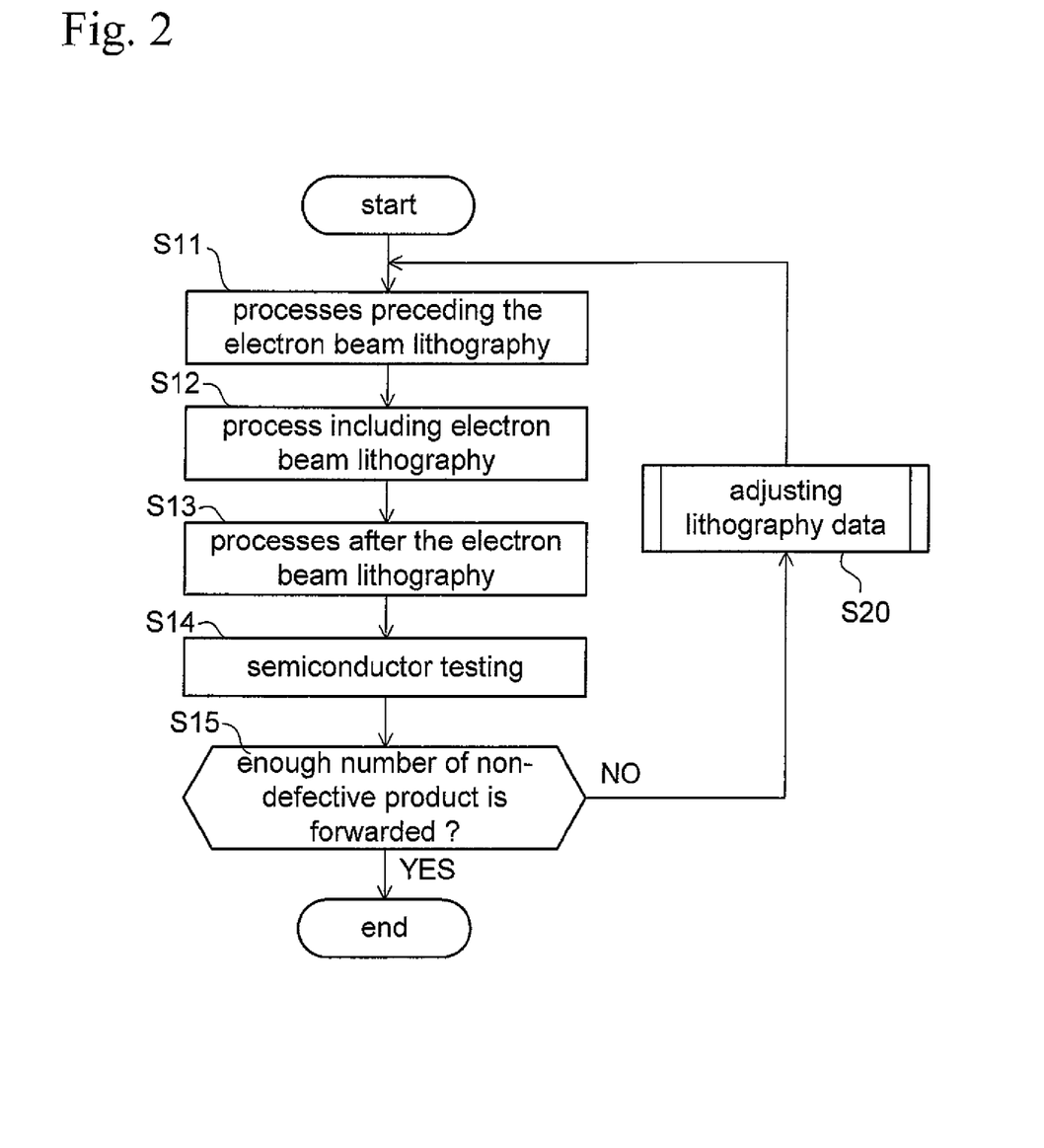
FIG. 2 is a flowchart of a method of manufacturing a semiconductor device according to the first embodiment.
Figure 3A:
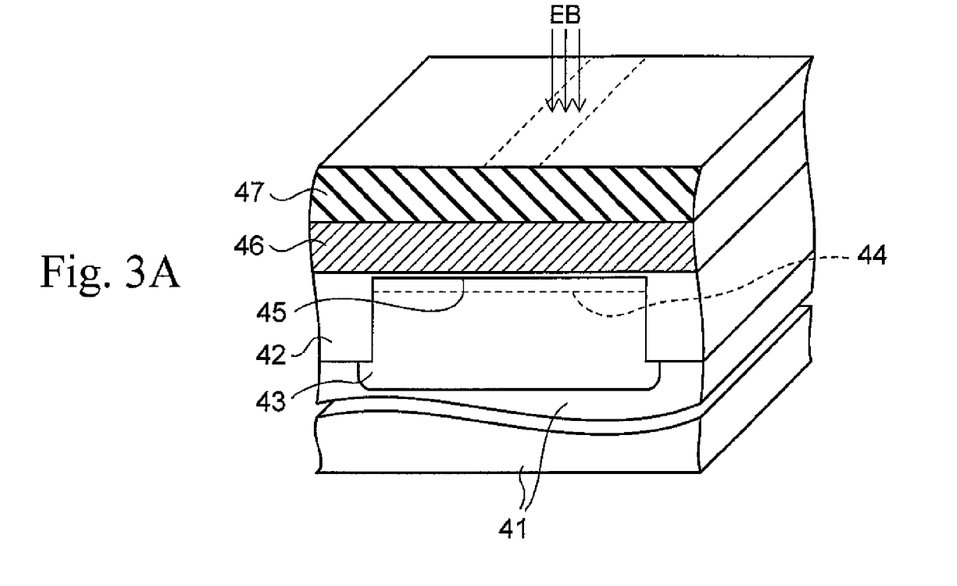
FIGS. 3A and 3B are views showing a method of forming a gate electrode of a transistor using electron beam lithography in the method of manufacturing a semiconductor device according to the first embodiment.
Figure 3B:
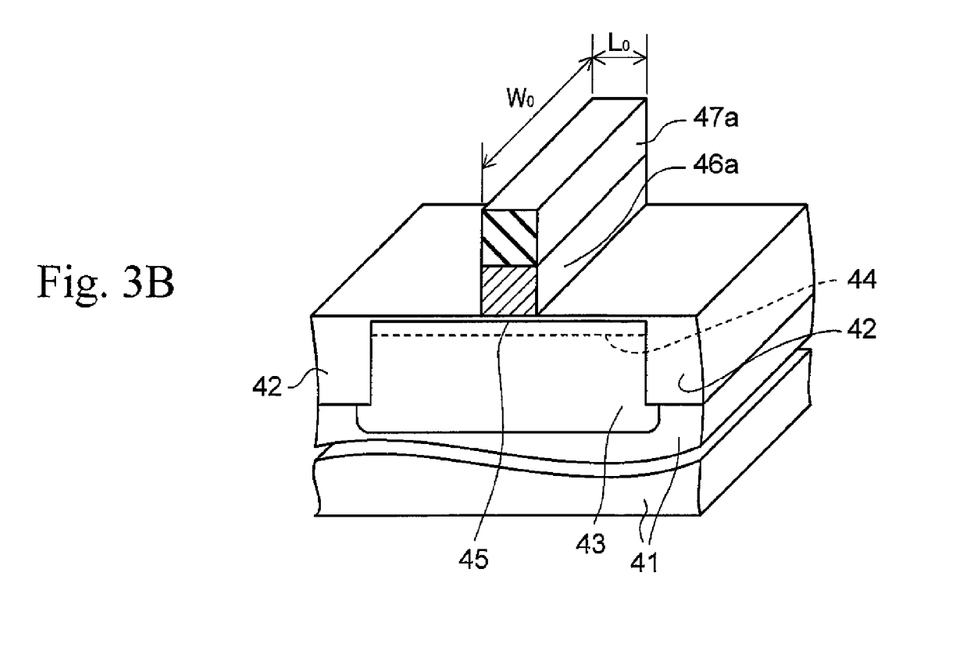

Now, a method of manufacturing a semiconductor device using the semiconductor manufacturing system 10 will be described below. FIG. 2 is a flowchart of the method of manufacturing a semiconductor device of this embodiment. FIGS. 3A and 3B are views showing a method of forming a gate electrode of a transistor using electron beam lithography in the method of manufacturing a semiconductor device of this embodiment.

To begin with, in step S11 of FIG. 2, the wafer processing section 1 (see FIG. 1) performs processes preceding the electron beam lithography. Here, the steps preceding formation of a resist film 47 shown in FIG. 3A are performed.

First, a silicon substrate is prepared as a wafer (a semiconductor substrate) 41. Then, an element isolation insulating film 42 to isolate an element region is formed by STI, for example. Thereafter, an impurity is ion-implanted into the element region isolated by the element isolation insulating film 42, thereby forming a well 43.

Next, an impurity is shallowly ion-implanted into an upper portion of the well 43, thereby forming a channel region 44. Thereafter, a surface of the wafer 41 provided with the channel region 44 is thermally oxidized and thereby formed into a gate insulating film 45.

Next, a polycrystalline silicon film is formed as a conductive film 46 on the gate insulating film 45. Then, a resist film 47 is formed on the conductive film 46.

Thus, the manufacturing processes preceding the electron beam lithography in step S11 of FIG. 2 are completed.

Next, a pattern is formed by using the electron beam lithography in step S12 of FIG. 2.

First, as shown in FIG. 3A, an electron beam EB is emitted onto a portion of the resist film 47 where a gate electrode of a transistor is to be formed.

Thereafter, as shown in FIG. 3B, a resist pattern 47a in the shape of the gate electrode is formed by developing the resist film 47. Then, a gate electrode 46a having a width of $W_0$ and a length of $L_0$ is formed by dry etching the conductive film 46 while using this resist pattern 47a as a mask.

Thereafter, the resist pattern 47a is removed.

In this way, formation of the pattern (the gate electrode) using the electron beam lithography in step S12 of FIG. 2 is completed.

Next, in step S13 of FIG. 2, the wafer processing section 1 (see FIG. 1) subjects the wafer 11 to processes after the electron beam lithography process.

First, the transistor is produced by forming source-drain regions of the transistor by ion implantation of an impurity while using the gate electrode 46a as a mask. Thereafter, an interlayer insulating film, plugs, and wiring are formed on the transistor to finish the semiconductor device.

Then, the wafer 41 provided with the semiconductor devices is cut into semiconductor chips.

Thus, the processes in step S13 to be performed after the electron beam lithography process are completed.

Next, in step S14, the electric characteristics of the semiconductor chips are measured with the semiconductor testing apparatus 2. Here, the electric characteristics to be measured include an amount of a drain current (a drain current characteristic) which flows at the time of application of given voltages respectively to a source electrode, a drain electrode, and the gate electrode of each transistor, a threshold voltage of the transistor, a signal propagation delay characteristic, a maximum operating frequency, a noise level, integral non-linearity, and differential non-linearity. Then, the semiconductor chips having the electric characteristics satisfying predetermined reference values are forwarded as non-defective products, whereas the rest of the semiconductor chips are rejected as defective products. In addition, the measurement results of the electric characteristics of the semiconductor chips are combined with positional information concerning the semiconductor chips on the wafer and are inputted to the controller 3 (see FIG. 1).

Next, in step S15, the controller 3 of the semiconductor manufacturing system 10 determines whether or not the number of the semiconductor chips forwarded as non-defective products reaches a preset number of non-defective products. Manufacturing of the semiconductor devices is terminated when the controller 3 determines that the number of non-defective semiconductor chips reaches a sufficient number (YES). On the other hand, step S20 takes place when the controller 3 determines that the number of non-defective semiconductor chips is insufficient (NO).

In the next step S20, the controller 3 adjusts the electron beam lithography data based on the measurement results of the electric characteristics of the semiconductor chips. A method of adjusting electron beam lithography data in step S20 will be specifically described below.

Figure 4:
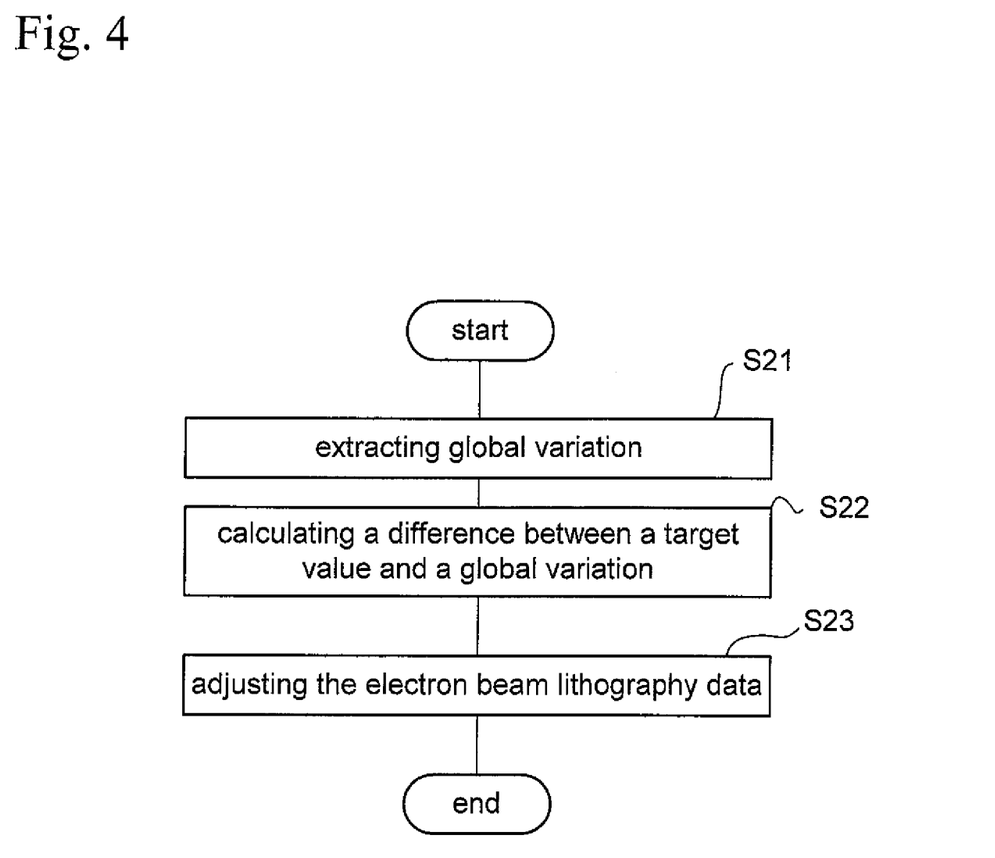
FIG. 4 is a flowchart showing a method of adjusting electron beam lithography data in FIG. 2.

FIG. 4 is a flowchart showing the method of adjusting electron beam lithography data in step S20 of FIG. 2.

First, in step S21, the global variation extraction unit 31 of the controller 3 extracts a global variation, which is a variation component dependent on the position on the wafer, based on the positions of the semiconductor chips on the wafer and the measurement results of the electric characteristics.

Here, the global variation is extracted by finding an approximate curved surface in accordance with a least square method.

Alternatively, variations in the electric characteristics along straight lines in two directions orthogonal to each other on the wafer surface (an X direction and a Y direction) may simply be extracted and approximate curved lines (or approximate straight lines) to the respective directions may be determined as global variations in the X direction and the Y direction.

Figure 5A:
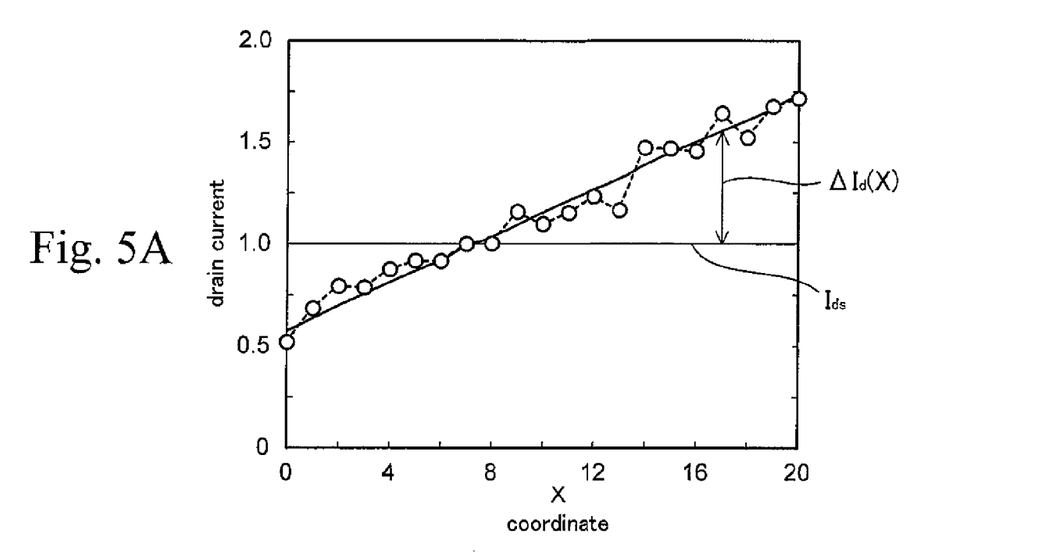
FIGS. 5A and 5B are views showing a method of detecting a global variation using a least square method.
Figure 5B:
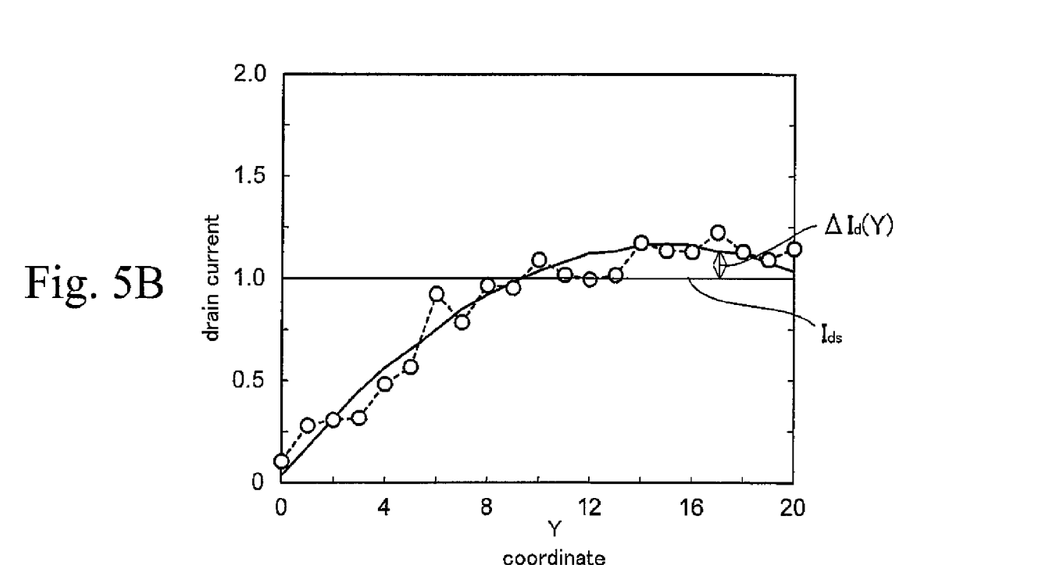

FIG. 5A is a graph showing distribution of a drain current characteristic along a straight line extending in a predetermined direction (the X direction) and FIG. 5B is a graph showing an example of distribution of a drain current characteristic along a straight line (in the Y direction) orthogonally intersecting with the straight line in FIG. 5A at the center of the wafer.

Here, an approximate straight line is derived from the distribution of the drain current characteristic shown in FIG. 5A in accordance with the least square method and this line is extracted as the global variation in the X direction.

Meanwhile, an approximate curved line is derived from the distribution of the drain current characteristic shown in FIG. 5B in accordance with the least square method and this line is extracted as the global variation in the Y direction.

Instead of the above-described least square method, the global variations may be extracted in this embodiment by any of the following methods.

FIGS. 6A to 6D are views showing a method of extracting a global variation using a low-pass filter which applies inverse Fourier transform.

Figure 6A:
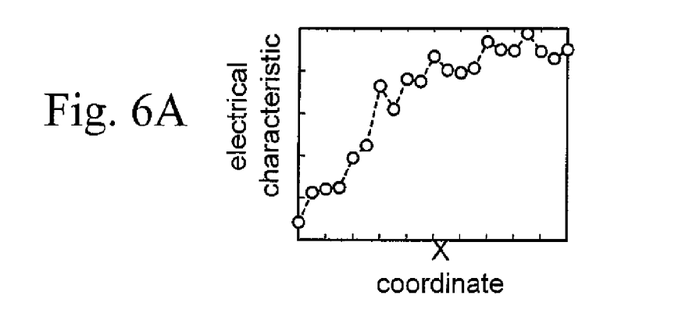
FIGS. 6A to 6D are views showing a method of extracting a global variation using a low-pass filter which applies inverse Fourier transform.
Figure 6B:
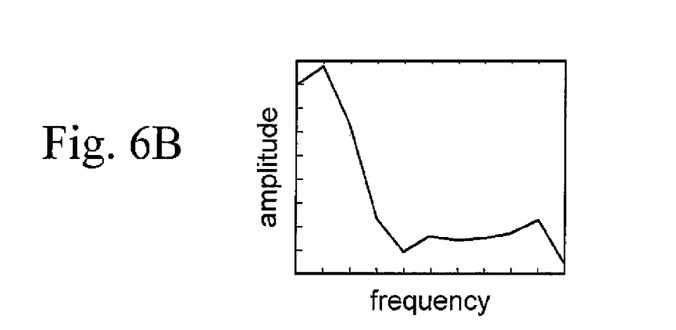

In this method, distribution of an electric characteristic shown in FIG. 6A is first subjected to Fourier transform, thereby obtaining distribution of amplitudes based on the frequency as shown in FIG. 6B.

Figure 6C:
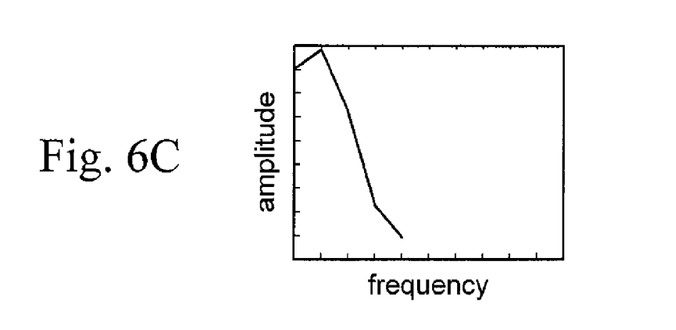

Next, as shown in FIG. 6C, components corresponding to a given frequency or lower are extracted from the distribution of amplitudes based on the frequency.

Figure 6D:
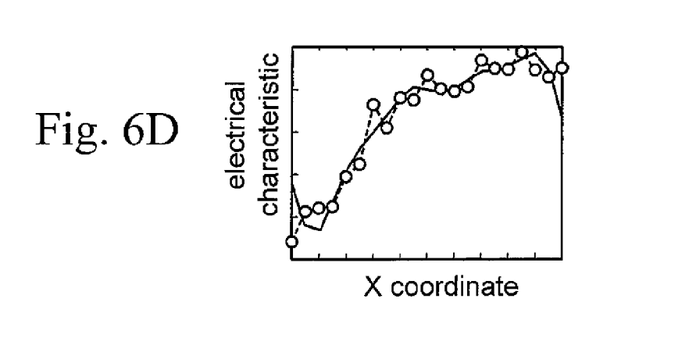

Then, as shown in FIG. 6D, the frequency components in FIG. 6C are subjected to inverse Fourier transform. This operation is equivalent to subjecting the variation in the electric characteristic to a low-pass filter. Thus, a global variation is obtained by removing high-frequency components attributed to local variations from the variation in the electric characteristic of FIG. 6A.

Figure 7A:
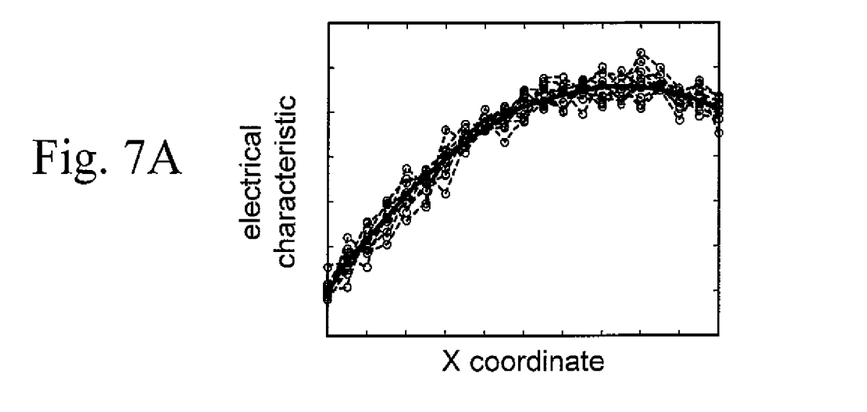
FIGS. 7A to 7C are views showing a method of extracting a global variation based on variations among a plurality of wafers.
Figure 7B:
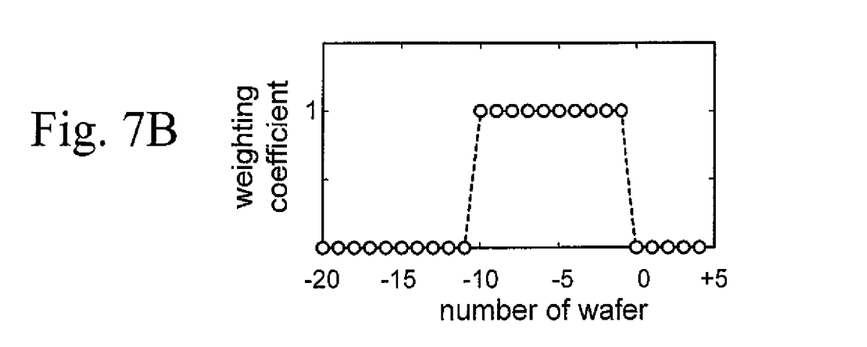
Figure 7C:
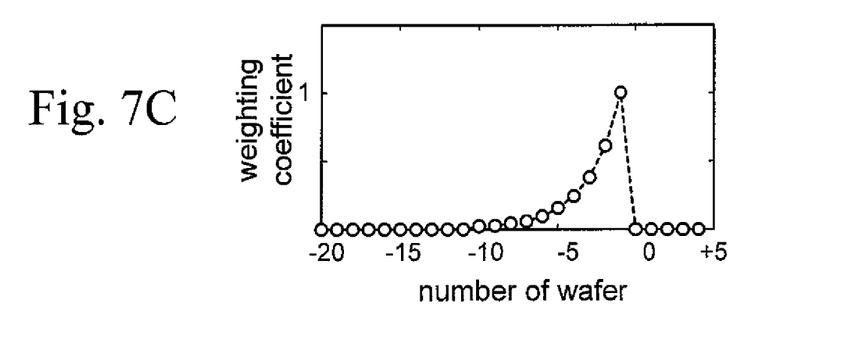

FIGS. 7A to 7C are views showing a method of extracting a global variation based on variations among a plurality of wafers.

As shown in FIG. 7A, in this method, data on variations in an electric characteristic among wafers in the past are extracted to begin with.

Next, a global variation is obtained by convolving the data of FIG. 7A with a function which gives the same weighting coefficient to the data in a past predetermined range as shown in FIG. 7B.

Here, the data of FIG. 7A is convolved with a function designed to provide the data on the past ten wafers with the same weighting coefficient equal to 1 and to provide the rest of the data with the weighting coefficient equal to 0 as shown in FIG. 7B. This operation corresponds to obtaining a moving average of the data on the past ten wafers. Such an averaging operation can remove local variations which are randomly generated and thereby obtain the global variation. The number of pieces of the past data used for obtaining the moving average is not limited only to ten. Instead, any sufficient number for averaging the local variations can be selected as appropriate.

Here, the global variation may be found by using a function as shown in FIG. 7C in place of the function shown in FIG. 7B. According to the function of FIG. 7C, a portion representing more recent data is provided with a greater weighting coefficient. As a consequence, a global variation which emphasizes data on the most recent wafers is obtained when the data of FIG. 7A is convolved with the function of FIG. 7C.

The global variation may be obtained by convolving the distribution data of FIG. 5A or FIG. 5B with a function which gives the same weighting coefficient to the data in a predetermined area in X or Y direction as shown in FIG. 7B. Further, the global variation may be obtained by convolving the distribution data of FIG. 5A or FIG. 5B with a function as shown in FIG. 7C.

Thus, extraction of the global variation in step S21 of FIG. 4 is completed.

Next, step S22 of FIG. 4 takes place where the characteristic comparison unit 33 (see FIG. 1) of the controller 3 reads the target characteristic data out of the target characteristic storage unit 32. Then, a difference between the target value of the electric characteristic and the global variation is found for each position on the wafer.

For example, in the case of the variation in the drain current characteristic shown in FIG. 5A, a difference $\Delta I_d(X)$ between a target value $I_{ds}$ of the drain current and the global variation is found for each position in the X direction on the wafer. Meanwhile, in the case of the variation in the drain current characteristic shown in FIG. 5B, a difference $\Delta I_d(Y)$ between a target value $I_{ds}$ of the drain current and the global variation is found for each position in the Y direction on the wafer.

Next, in step S23 of FIG. 4, the lithography data adjustment unit 34 (see FIG. 1) of the controller 3 adjusts the electron beam lithography data in each position on the wafer so as to minimize each of the differences found in step S22.

Here, a drain current $I_d$ of a transistor can be expressed by the following formula on the assumption that a width of a gate electrode is W, a length of the gate electrode is L, channel mobility is $\mu_0$ (cm$^2$/V·s), capacitance of a gate insulating film per unit area is $C_{ox}$ (F/cm$^2$), a threshold voltage of the transistor is $V_{th}$ (V), a gate voltage is $V_{GS}$, and a drain voltage is $V_{DS}$.

(Expression 1)

$$I_d = \frac{\mu_0 C_{ox} W}{L}\left[(V_{GS} - V_T) - \left(\frac{V_{DS}}{2}\right)\right]V_{DS} \quad (1)$$

As understood from the above Formula 1, the value of the drain current $I_d$ can be changed by a proportion W/L between the width W and the length L of the gate electrode.

Figure 8A:
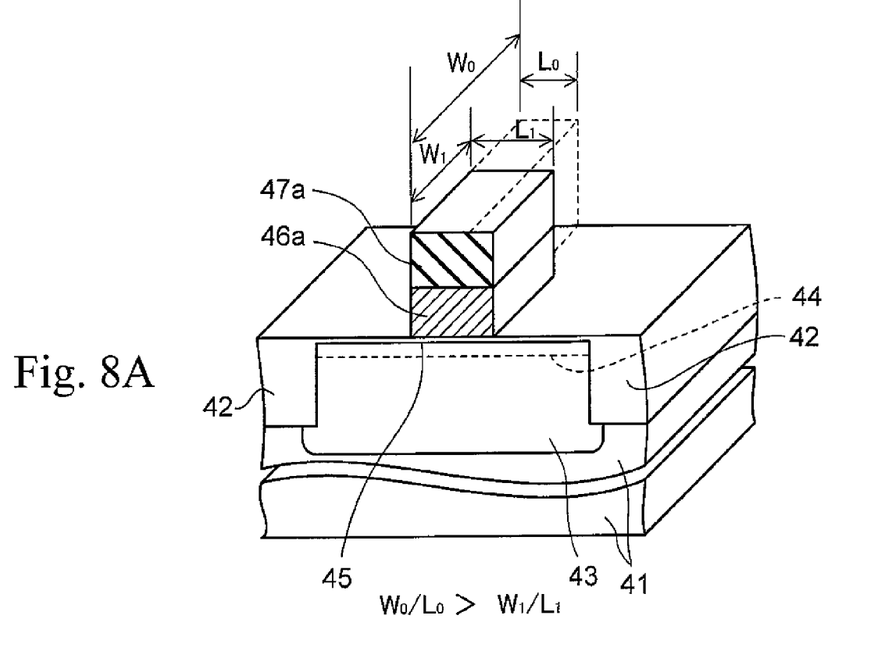
FIG. 8A is a view showing a method of adjusting electron beam lithography data at a portion in which a drain current characteristic of a transistor is higher than a target characteristic.

Accordingly, in this embodiment, the proportion W/L between the width and length of the gate electrode is decreased in an amount corresponding to the difference $\Delta I_d(X)$ or $\Delta I_d(Y)$ from the target value at a portion where the drain current $I_d$ is greater than the target value. Specifically, as shown in FIG. 8A, the width W of the gate electrode is adjusted from an original width $W_0$ to a smaller width $W_1$ while the length L of the gate electrode is adjusted from an original length $L_0$ to a larger length $L_1$.

Figure 8B:
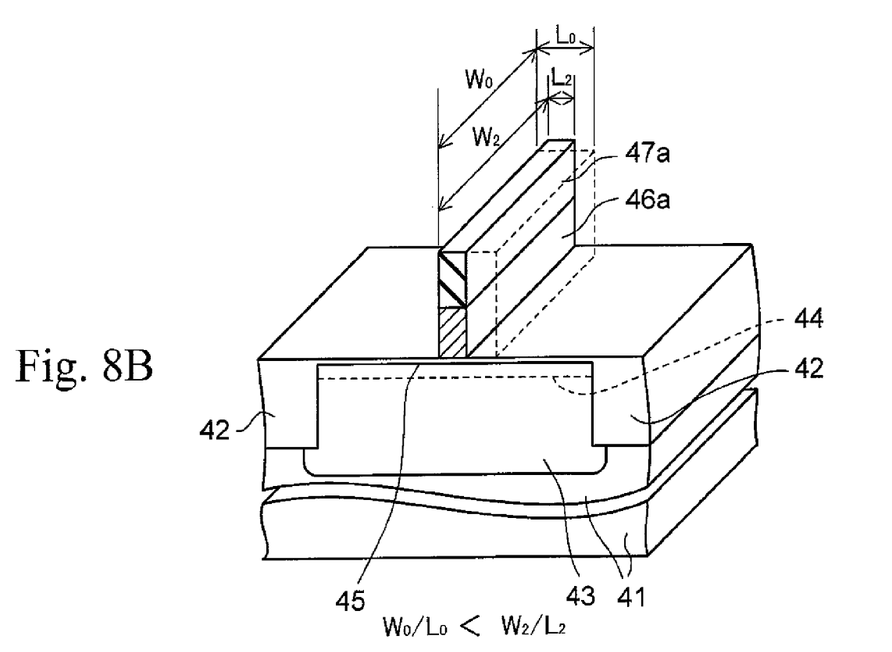
FIG. 8B is a view showing an example of the method of adjusting electron beam lithography data at a portion in which the drain current characteristic of the transistor is lower than the target characteristic.

On the other hand, the proportion W/L between the width and length of the gate electrode is increased in an amount corresponding to the difference $\Delta I_d(X)$ or $\Delta I_d(Y)$ from the target value at a portion where the drain current $I_d$ is smaller than the target value. Specifically, as shown in FIG. 8B, the width W of the gate electrode is adjusted from the original width $W_0$ to a larger width $W_2$ while the length L of the gate electrode is adjusted from the original length $L_0$ to a smaller length $L_2$.

Here, it is also possible to adjust only one of the width W and the length L of the gate electrode.

In this way, the electron beam lithography data is adjusted so as to minimize the differences between the global variation and the target values, and step S23 is completed.

Thereafter, the next wafer is processed in step S11 of FIG. 2.

As described above, according to this embodiment, the variations in the electric characteristics among the semiconductor devices within the wafer surface are reduced by adjusting the electron beam lithography data. For this reason, it is possible to drastically decrease the number of operating steps and costs for reduction in the variations as compared to a case of optimizing manufacturing conditions individually in the procedures including lithography, ion implantation, annealing, film deposition, CMP, and so forth.

In addition, results of semiconductor tests carried out in every wafer processing are used for an adjustment of the electron beam lithography data. Accordingly, this embodiment can deal not only with the variations within the wafer surface but also with variations in processing conditions over time, such as deterioration in apparatuses used in the respective procedures.

Although the above description has been given of the case of adjusting the variation in the characteristic among the chips within the wafer surface, the method of this embodiment can also be used for reducing a variation in the electric characteristic of transistors within each chip surface.

(Modified Example of Method of Adjusting Electron Beam Lithography Data)

Figure 9:
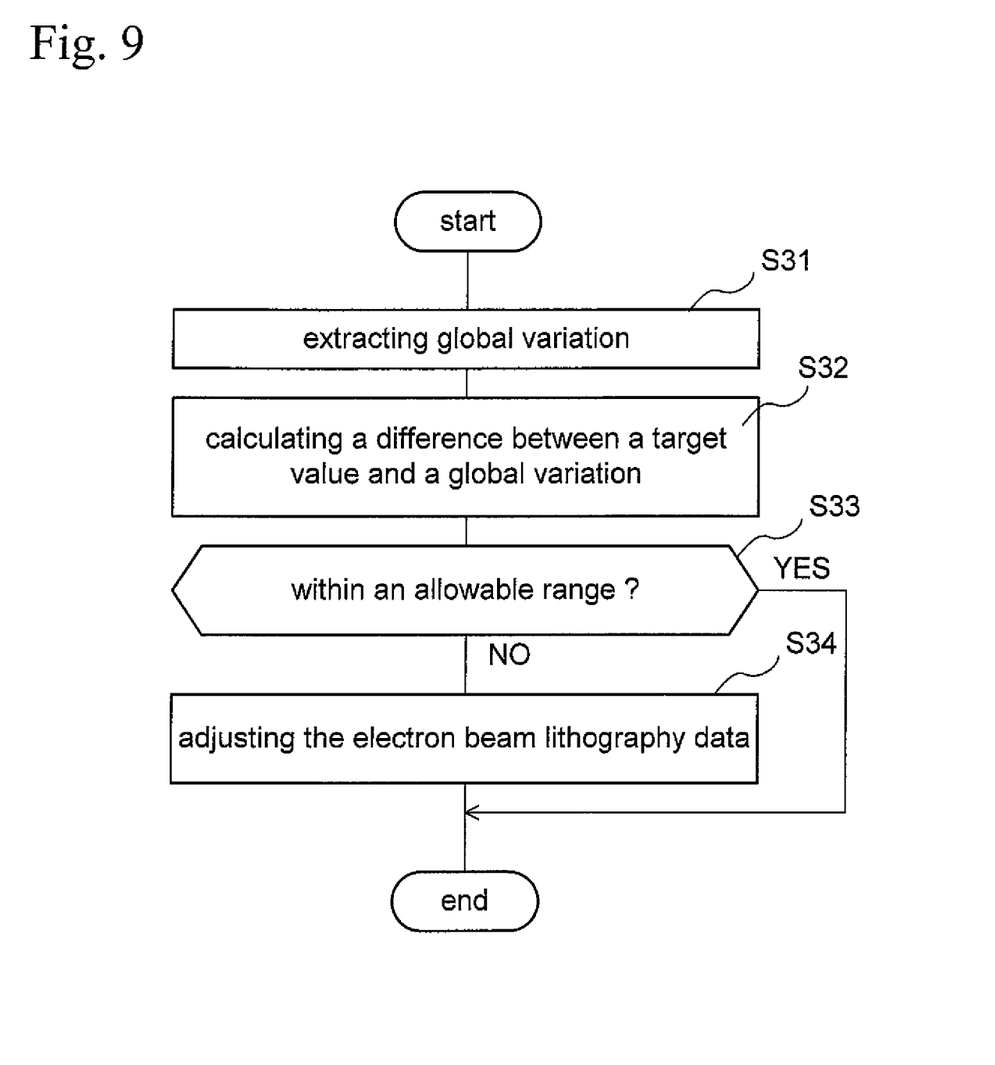
FIG. 9 is a flowchart showing a modified example of the method of adjusting electron beam lithography data of FIG. 4.

FIG. 9 is a flowchart showing a modified example of the method of adjusting electron beam lithography data of FIG. 4.

As shown in FIG. 9, in this modified example, the global variation is first extracted in step S31 and the difference between the global variation and the target characteristic is found in subsequent step S32. The steps so far are similar to step S21 and step S22 of FIG. 4.

In the next step S33, the lithography data adjustment unit 34 of the controller 3 determines whether or not the difference between a target value of the target characteristic data and the global variation falls within an allowable range at every portion across the wafer. Here, upon determination (YES) that the difference between the target value and the global variation falls within the allowable range at every portion across the wafer, the electron beam lithography data adjustment unit does not adjust the electron beam lithography data and applies the electron beam lithography data used in the previous lithography operation without change.

On the other hand, step S34 takes place when determination (NO) is made in step S33 that there is a semiconductor chip having a difference between the target value and the global variation which does not fall within the allowable range.

In the next step S34, the electron beam lithography data is adjusted in accordance with a method similar to step S23 of FIG. 6.

As described above, in this modified example, the adjustment of the electron beam lithography data is omitted when the differences between the target values and the global variation fall within the allowable range. This makes it possible to save time required for adjusting the electron beam lithography data and thereby to improve throughput.

Second Embodiment

Figure 10:
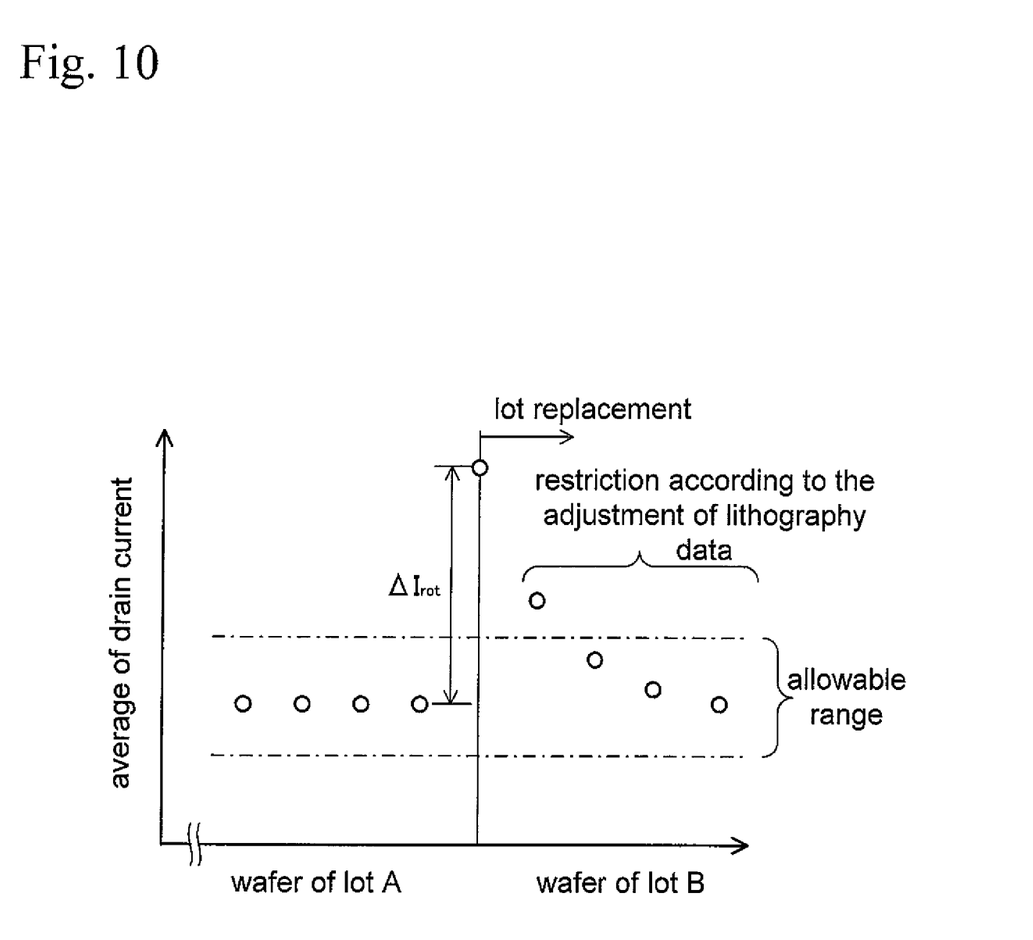
FIG. 10 is a view showing fluctuations in the drain current characteristic of transistor when a wafer lot is replaced, in the method of manufacturing a semiconductor device described with reference to FIG. 2 to FIG. 9.

FIG. 10 is a view showing fluctuations in the drain current characteristic of transistors when a wafer lot is replaced, in the method of manufacturing a semiconductor device described with reference to FIG. 2 to FIG. 9.

As shown in FIG. 10, according to the method of manufacturing a semiconductor device of the first embodiment, an average value of the electric characteristic (the drain current of the transistor) of the semiconductor device significantly changes immediately after a wafer lot is replaced. This is attributed to the fact that the impurity concentration differs between wafers belonging to different lots and the drain current of the semiconductor device changes in the amount equivalent to the difference in the impurity concentration.

Note that an adjustment of the electron beam lithography data is performed on and after the second wafer in the replaced lot. Accordingly, the variation in the electric characteristic is gradually restored along with the increase in the number of processed wafers.

However, the electron beam lithography data cannot be properly adjusted for the wafer to be processed immediately after the lot replacement, and the production yield of the semiconductor devices on this wafer is deteriorated.

In view of the above, a second embodiment described below is a semiconductor manufacturing system and a method of manufacturing a semiconductor device, which are capable of reducing a variation in an electric characteristic of a semiconductor device to be manufactured immediately after replacement of a wafer lot.

Figure 11:
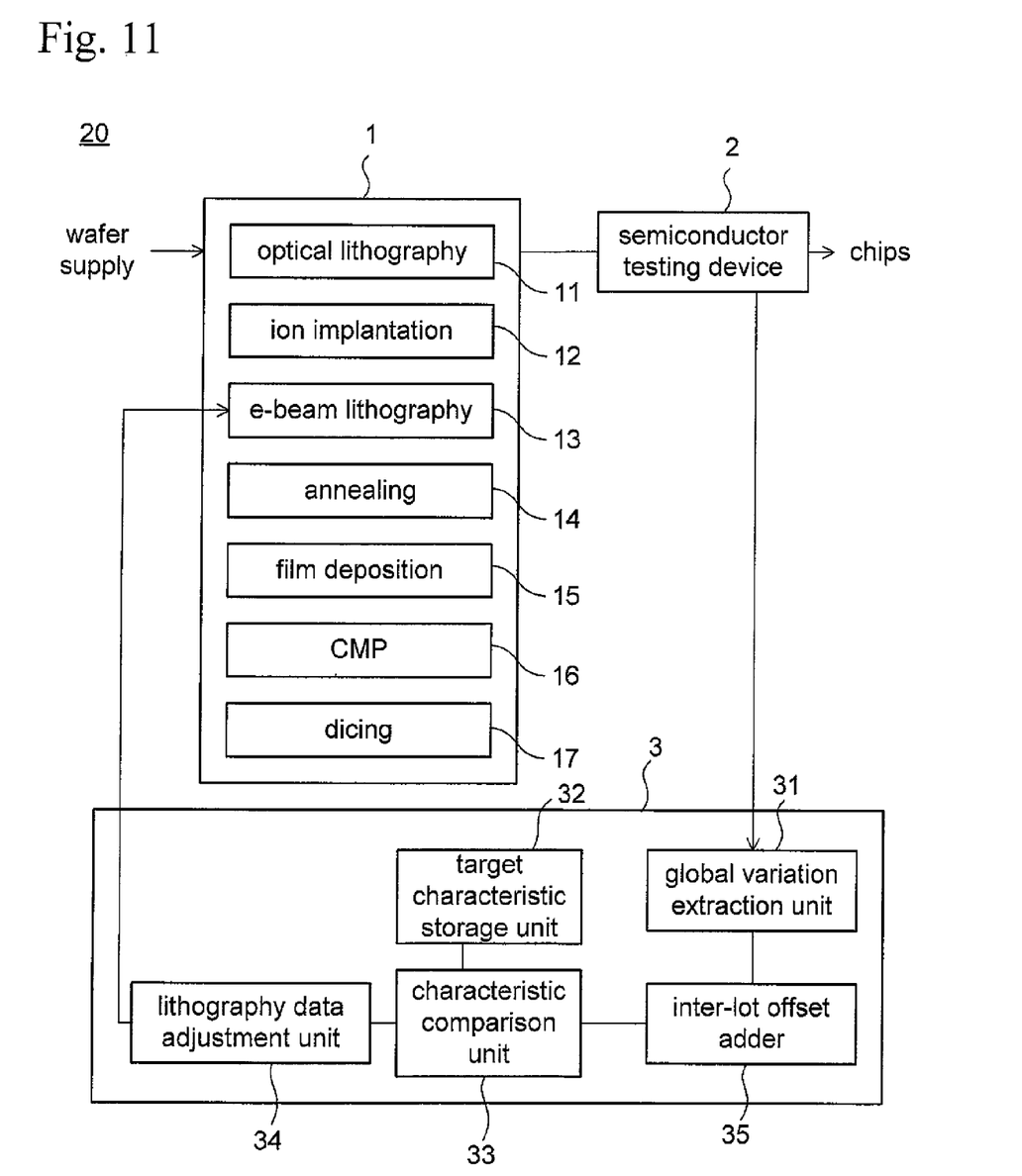
FIG. 11 is a block diagram of a semiconductor manufacturing system according to a second embodiment.
Figure 12:
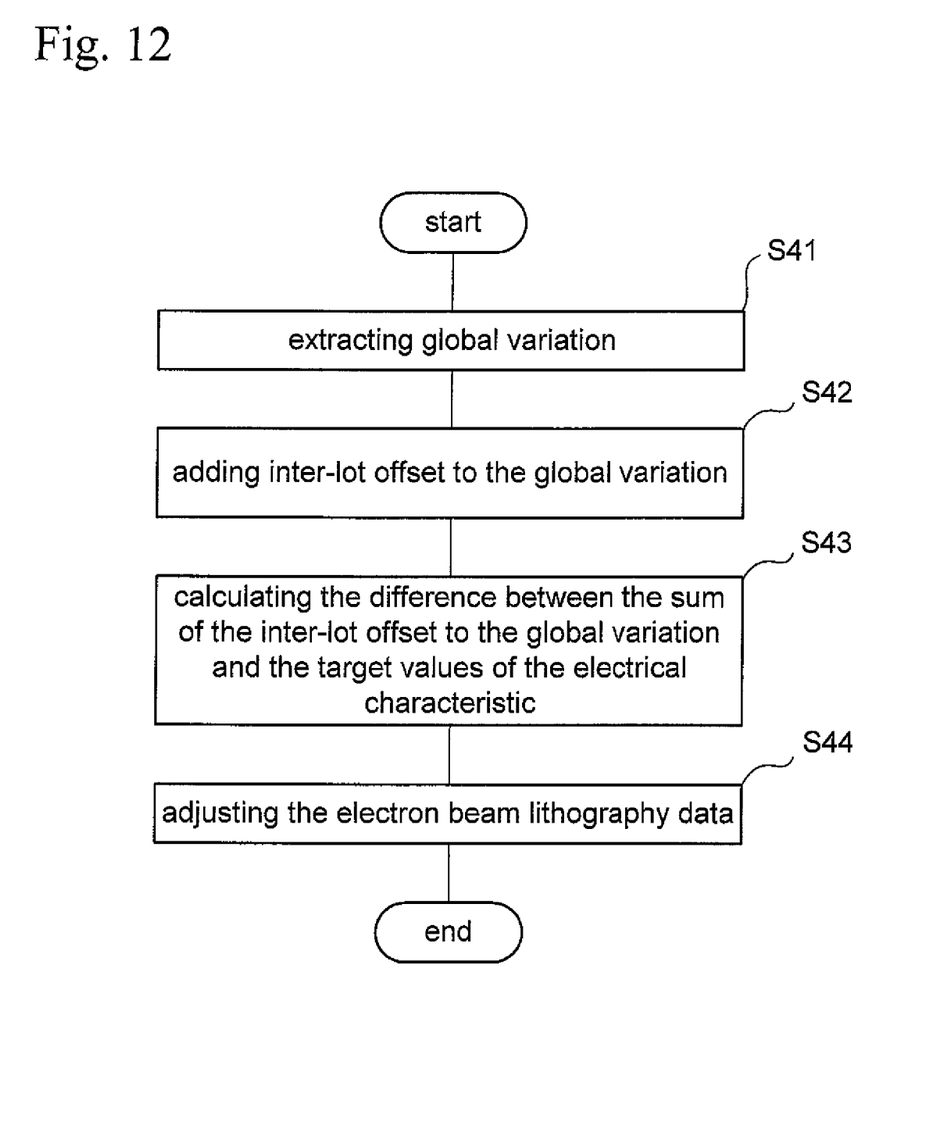
FIG. 12 is a flowchart showing a method of adjusting electron beam lithography data in a method of manufacturing a semiconductor device according to the second embodiment.

FIG. 11 is a block diagram of a semiconductor manufacturing system according to the second embodiment, and FIG. 12 is a flowchart showing a method of adjusting electron beam lithography data in a method of manufacturing a semiconductor device according to the second embodiment.

A semiconductor manufacturing system 20 shown in FIG. 11 is different from the semiconductor manufacturing system 10 shown in FIG. 1 in that a controller 3 of the second embodiment includes an inter-lot offset adder 35 which is located between a global variation extraction unit 31 and a characteristic comparison unit 33.

The inter-lot offset adder 35 calculates a change (an inter-lot offset) in the electric characteristic before and after replacement of the lot, based on an impurity concentration of a wafer before the replacement of the lot and an impurity concentration of a wafer after the replacement of the lot, for example. Then, before processing the first wafer after the lot replacement, the inter-lot offset adder 35 adds the calculated inter-lot offset to the global variation detected by the global variation extraction unit 31, and outputs the result to the characteristic comparison unit 33.

Note that the other configurations of the semiconductor manufacturing system 20 are similar to those of the semiconductor manufacturing system 10 of FIG. 1, and the same constituents are therefore denoted by the same reference numerals and explanation thereof is omitted. Moreover, the method of manufacturing a semiconductor device of this embodiment is similar to the method of manufacturing a semiconductor device described with reference to FIG. 2, except for the method of adjusting electron beam lithography data (step S20).

Now, the method of adjusting electron beam lithography data of this embodiment will be described below.

FIG. 12 is a flowchart showing the method of adjusting electron beam lithography data of this embodiment.

As shown in FIG. 12, first in step S41, the global variation extraction unit 31 of the controller 3 extracts a global variation. Here, the method of extracting a global variation in step S41 is carried out in accordance with a method similar to extraction of the global variation in step S21 of FIG. 4.

Next, in step S42, the inter-lot offset adder 35 of the controller 3 calculates the change (the inter-lot offset) in the electric characteristic before and after the replacement of the lot, based on the impurity concentration of the wafer before and after the replacement of the lot. Here, the value of the inter-lot offset is assumed to be the same across the wafer surface. Subsequently, the inter-lot offset adder 35 adds this inter-lot offset to the global variation and outputs the value thus obtained to the characteristic comparison unit 33.

Next, in step S43, the characteristic comparison unit 33 of the controller 3 reads the target characteristic data out of the target characteristic storage unit 32, and finds the differences between the target values of the electric characteristic and the sum of the inter-lot offset to and the global variation.

Thereafter, in step S44, the lithography data adjustment unit 34 of the controller 3 adjusts the electron beam lithography data so as to minimize the differences between the target values of the electric characteristic and the sum of the inter-lot offset and the global variation.

As described above, in this embodiment, the electron beam lithography data is adjusted in accordance with the difference in the impurity concentration between the lots, before processing the first wafer after the replacement of the lot. This makes it possible to reduce the variation in the electric characteristic of the first wafer immediately after the replacement of the lot. Thus, it is possible to prevent deterioration in the production yield on the wafer immediately after the replacement of the lot.

Other Embodiments

Although the above description has been given of the example of reducing the variation in the drain current among the transistors, this embodiment is also applicable to reduction in variations in various electric characteristics other than the drain current.

A variation in delay time or an operating speed of a transistor included in a logic circuit or the like depends on the magnitude of the drain current of the transistor. For this reason, a variation in the delay time or the operating speed can also be reduced by adjusting the proportion W/L of the width W and the length L of the gate electrode in the electron beam lithography data as in the case of reduction in the variation in the drain current.

In the meantime, any of noise, integral non-linearity, and differential non-linearity of a transistor used in an analog circuit such as an AD converter or a DA converter is known to be reduced when the area of the gate electrode of the transistor is increased.

Accordingly, based on a result of measurement of any of the noise, integral non-linearity, and differential non-linearity using the semiconductor testing apparatus 2, the electron beam lithography data may be adjusted in such a manner as to increase the area of the gate electrode of the transistor having a noise characteristic or the like exceeding a predetermined reference value.

Further, an impedance characteristic of any of a power wire and a ground wire in a semiconductor device is known to vary with the number of contact plugs provided therein, a width of a wiring pattern, and the like.

Accordingly, the contact plugs and the wiring pattern of the semiconductor device may be formed by use of the electron beam lithography apparatus 13, and the number of juxtaposed contact plugs or the width of the wiring pattern in the electron beam lithography data used in the lithography may be adjusted according to the variation in the impedance characteristic.

In this case, the number of shots of the electron beam in the electron beam lithography procedure may be reduced and processing time may be shortened by reducing the number of the contact plugs to be located, at a portion where the impedance characteristic or any of the power wire and the ground wire falls below the target value.

What is claimed is:

1. A method of manufacturing a semiconductor device using an electron beam lithography apparatus configured to emit an electron beam to perform lithography of a pattern, the method comprising:
    a wafer processing step of forming a semiconductor device by performing processing inclusive of pattern formation on a wafer using the electron beam lithography apparatus;
    a wafer cutting step of cutting the wafer provided with semiconductor devices into semiconductor chips;
    a semiconductor testing step of measuring an electric characteristic of the semiconductor chip and combining the electric characteristics of the semiconductor chips with positional information concerning the semiconductor chips on the wafer; and a lithography data adjusting step of adjusting electron beam lithography data used by the electron beam lithography apparatus on the basis of a variation in the electric characteristic of the semiconductor chip within a surface of the wafer, wherein the wafer processing step, the wafer cutting step, the semiconductor testing step, and the lithography data adjusting step are repeatedly carried out.

2. The method of manufacturing a semiconductor device according to claim 1, wherein the lithography data adjusting step comprises the steps of:

extracting a global variation from the variation in the electric characteristic of the semiconductor device, the global variation being a component dependent on a position on the wafer;

finding a difference between the global variation and a target value of the electric characteristic for each of a plurality of positions on the wafer; and adjusting a pattern shape of the electron beam lithography data on the basis of the difference between the global variation and the target value of the electric characteristic.

3. The method of manufacturing a semiconductor device according to claim 2, wherein the electron beam lithography apparatus is used to form a gate electrode of a transistor included in the semiconductor device.

4. The method of manufacturing a semiconductor device according to claim 3, wherein the electric characteristic is an amount of a drain current flowing at the time of application of a given gate voltage to the gate electrode of the transistor, and in the lithography data adjusting step, a proportion W/L between a width W and a length L of the gate electrode for each of the plurality of positions on the surface of the wafer is adjusted to minimize a variation in the amount of the drain current.

5. The method of manufacturing a semiconductor device according to claim 3, wherein the electric characteristic is any of noise and non-linearity of the transistor, and in the lithography data adjusting step, an adjustment is made to increase an area of the gate electrode for a portion having any of the noise and the non-linearity of the transistor exceeding a given reference value.

6. The method of manufacturing a semiconductor device according to claim 2, wherein the lithography data adjusting step comprises an inter-lot offset adding step of adding an inter-lot offset to the global variation, the inter-lot offset being an amount of variation in the electric characteristic of the semiconductor device caused by replacement of a wafer lot, and the pattern shape of the electron beam lithography data is adjusted based on a difference between the target value of the electric characteristic and the sum of the inter-lot offset and the global variation.

* * * * *

UNITED STATES PATENT AND TRADEMARK OFFICE
CERTIFICATE OF CORRECTION

PATENT NO. : 9,070,607 B2  
APPLICATION NO. : 13/656186  
DATED : June 30, 2015  
INVENTOR(S) : Ishida et al.

Page 1 of 1

It is certified that error appears in the above-identified patent and that said Letters Patent is hereby corrected as shown below:

Title Page (72) Please change the third inventor's name "Masayuki Kawanabe" to --Masayuki Kawabata--.

Signed and Sealed this  
Seventeenth Day of May, 2016

Michelle K. Lee  
*Director of the United States Patent and Trademark Office*